United States Patent
Tanabe et al.

(10) Patent No.: US 9,518,321 B2
(45) Date of Patent: Dec. 13, 2016

(54) ATOMIC LAYER DEPOSITION PROCESSING APPARATUS TO REDUCE HEAT ENERGY CONDUCTION

(71) Applicant: HITACHI KOKUSAI ELECTRIC INC., Tokyo (JP)

(72) Inventors: Mitsuro Tanabe, Toyama (JP);
Yoshihiko Yanagisawa, Toyama (JP);
Kazuhiro Yuasa, Toyama (JP);
Masanori Sakai, Toyama (JP);
Yasutoshi Tsubota, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 6 days.

(21) Appl. No.: 14/483,619

(22) Filed: Sep. 11, 2014

(65) Prior Publication Data
US 2016/0032457 A1   Feb. 4, 2016

(30) Foreign Application Priority Data

Jul. 31, 2014 (JP) ................................. 2014-156333

(51) Int. Cl.
| C23C 16/458 | (2006.01) |
|---|---|
| C23C 16/46 | (2006.01) |
| C23C 16/52 | (2006.01) |
| C23C 16/455 | (2006.01) |
| C23C 16/44 | (2006.01) |

(Continued)

(52) U.S. Cl.
CPC ....... *C23C 16/4585* (2013.01); *C23C 16/4411* (2013.01); *C23C 16/4586* (2013.01); *C23C 16/45525* (2013.01); *C23C 16/45582* (2013.01); *C23C 16/46* (2013.01); *C23C 16/463* (2013.01); *C23C 16/52* (2013.01); *B05C 9/14* (2013.01); *B05C 11/1015* (2013.01); *H01L 21/67248* (2013.01); *H05B 1/0233* (2013.01)

(58) Field of Classification Search
CPC ................... B05C 11/1015; B01J 19/08; B01J 2219/0871; C23C 16/46; C23C 16/48; C23C 16/50
USPC ......................................... 118/725, 724, 712
See application file for complete search history.

(56) References Cited

U.S. PATENT DOCUMENTS

| 4,951,603 A | * | 8/1990 | Yoshino et al. | ............... 118/719 |
| 5,558,717 A | * | 9/1996 | Zhao et al. | .................... 118/715 |

(Continued)

FOREIGN PATENT DOCUMENTS

| JP | 62-280367 | 12/1987 |
| JP | 10-060650 | 3/1998 |

(Continued)

*Primary Examiner* — Karl Kurple
(74) *Attorney, Agent, or Firm* — Volpe and Koenig, P.C.

(57) ABSTRACT

Embodiments of the invention relate to apparatuses and methods for depositing materials on substrates during atomic layer deposition processes. In one embodiment, a substrate processing apparatus comprises a chamber lid assembly including a first heating member, a susceptor positioned proximal to the chamber lid assembly, wherein the susceptor includes a second heating member for heating the substrate, a process chamber accommodating at least the chamber lid assembly and the susceptor and a controller configured to control the first heating member so as to refrain the conduction of heat energy generated by the second heating member from the susceptor to the chamber lid assembly.

4 Claims, 4 Drawing Sheets

(51) Int. Cl.
  *B05C 9/14* (2006.01)
  *B05C 11/10* (2006.01)
  *H05B 1/02* (2006.01)
  *H01L 21/67* (2006.01)

(56) References Cited

U.S. PATENT DOCUMENTS

| | | | | |
|---|---|---|---|---|
| 5,831,249 | A * | 11/1998 | Rohner et al. | 219/413 |
| 5,997,649 | A * | 12/1999 | Hillman | 118/715 |
| 6,143,077 | A | 11/2000 | Ikeda et al. | |
| 6,258,170 | B1 * | 7/2001 | Somekh | C23C 16/4401 |
| | | | | 118/715 |
| 6,453,992 | B1 * | 9/2002 | Kim | 165/206 |
| 7,211,769 | B2 * | 5/2007 | Kim et al. | 219/390 |
| 7,425,838 | B2 * | 9/2008 | Itakura et al. | 324/757.03 |
| 7,780,789 | B2 * | 8/2010 | Wu et al. | 118/715 |
| 8,366,830 | B2 * | 2/2013 | Nakamura et al. | 118/725 |
| 8,475,596 | B2 * | 7/2013 | Pei | 118/726 |
| 8,486,845 | B2 * | 7/2013 | Matsuda | 438/788 |
| 8,622,020 | B2 * | 1/2014 | Thie et al. | 118/427 |
| 8,770,143 | B2 * | 7/2014 | Endo et al. | 118/723 R |
| 8,778,079 | B2 | 7/2014 | Begarney et al. | |
| 8,821,637 | B2 * | 9/2014 | Gelatos et al. | 118/715 |
| 8,911,552 | B2 * | 12/2014 | Jacobson | 118/610 |
| 8,933,375 | B2 * | 1/2015 | Dunn et al. | 219/390 |
| 8,941,969 | B2 * | 1/2015 | Thach et al. | 361/234 |
| 2001/0035127 | A1 * | 11/2001 | Metzner et al. | 118/715 |
| 2001/0054387 | A1 * | 12/2001 | Frankel et al. | 118/725 |
| 2002/0073922 | A1 * | 6/2002 | Frankel et al. | 118/715 |
| 2002/0144657 | A1 * | 10/2002 | Chiang et al. | 118/723 E |
| 2003/0079686 | A1 * | 5/2003 | Chen | C23C 16/34 |
| | | | | 118/715 |
| 2003/0155939 | A1 * | 8/2003 | Lutz et al. | 324/760 |
| 2005/0173068 | A1 * | 8/2005 | Chen et al. | 156/345.33 |
| 2007/0205787 | A1 * | 9/2007 | Natsuhara et al. | 324/760 |
| 2008/0102208 | A1 * | 5/2008 | Wu et al. | 427/255.28 |
| 2008/0107809 | A1 * | 5/2008 | Wu et al. | 427/248.1 |
| 2008/0152821 | A1 * | 6/2008 | Gardner et al. | 427/421.1 |
| 2009/0045829 | A1 * | 2/2009 | Awazu et al. | 324/755 |
| 2009/0084317 | A1 * | 4/2009 | Wu | C23C 16/45563 |
| | | | | 118/728 |
| 2010/0227478 | A1 * | 9/2010 | Harada | 438/735 |
| 2011/0223334 | A1 * | 9/2011 | Yudovsky et al. | 427/255.23 |
| 2013/0306621 | A1 * | 11/2013 | Chang | H01L 21/67115 |
| | | | | 219/497 |
| 2014/0261159 | A1 * | 9/2014 | Okabe et al. | 117/98 |
| 2014/0311411 | A1 * | 10/2014 | Yang | C23C 16/45572 |
| | | | | 118/733 |

FOREIGN PATENT DOCUMENTS

| | | |
|---|---|---|
| JP | H11-117071 | 4/1999 |
| JP | 2001-152344 | 6/2001 |
| JP | 2011-500961 | 1/2011 |
| JP | 3176540 U | 6/2012 |
| WO | 2011/112617 A2 | 9/2011 |

* cited by examiner

ATOMIC LAYER DEPOSITION PROCESSING APPARATUS TO REDUCE HEAT ENERGY CONDUCTION

CROSS-REFERENCE TO RELATED APPLICATION

This application claims benefit of Japanese Patent Application No. 2014-156333, filed on Jul. 31, 2014.

BACKGROUND OF THE INVENTION

1. Field of the Invention

Embodiments of the invention generally relate to a substrate processing apparatus, non-transitory computer-readable recording medium thereof.

2. Description of the Related Art

In recent years, semiconductor devices such as flash memories show a tendency toward high integration. With this situation, dimensions of interconnects in a pattern in LSI have been greatly shrinking. When these patterns are formed, as one production process of the manufacturing process, specific processes such as oxidation or nitriding may be carried out on a substrate.

As one of the methods to form the pattern mentioned above, there is a process of forming seed layers, liner films or wiring in trenches, contacts and other features between circuits. These trenches, contacts and other features need to have a high aspect ratio according to a tendency of the recent shrinking dimensions of interconnects in LSI.

When liner film is formed, it is required that the film have good step coverage with no dispersion of the film thickness in the upper lateral face of the trench, middle lateral face of it, lower lateral face of it and bottom face of it. Characteristics between trenches in semiconductor device can be made uniform by forming films having good step coverage. Characteristic dispersion of the semiconductor device can be thereby restrained.

The processes using heated gases or plasma activated gases have been tried for processing the films having trenches with such a high aspect ratio, but it was difficult to form the film which has good step coverage.

As a method to form the film mentioned above, there is a method to react gases in a substrate surface by alternatively supplying at least two kind of process gases.

On the other hand, when film is formed, it is necessary to heat a substrate uniformly or supply gases to the substrate uniformly. A single wafer tool that can deliver gases uniformly was developed. This single wafer tool has a gas dispersing channel having a diameter which spreads so as to get closer to the wafer, for supplying gases uniformly. To heat a substrate uniformly, the heater is included in the susceptor.

This single wafer tool has a gas dispersing channel having a diameter which spreads so as to get closer to wafer. In other words, there is no wall that defines a specific part of gas dispersing channel at near the position corresponding to the center of the wafer, and there is a wall that defines a peripheral part of gas dispersing channel near the position corresponding to the outside of the wafer. With the apparatus having such a configuration, the inventors found a problem that heat of the outside part of the substrate receiving surface on susceptor may be absorbed in the wall defining the chamber lid assembly. As a result, it was difficult to control the temperature of wafer surface uniformly.

SUMMARY OF THE INVENTION

Embodiments of the invention relate to a substrate processing apparatus for uniformly delivering gases to a substrate and heating a substrate at the same time and a chamber lid assembly thereof.

In one embodiment, a substrate processing apparatus is provided which a chamber lid assembly including a first heating member, a susceptor arranged close to the chamber lid assembly, said susceptor including a second heating member for heating the substrate, a process chamber accommodating at least the chamber lid assembly and the susceptor and a controller configured to control the first heating member so as to reduce the conduction of heat energy generated by the second heating member from the susceptor to the chamber lid assembly.

In another embodiment, a chamber lid assembly is provided which includes a gas dispersing channel having a diameter which spreads so as to get closer the lower portion, a heating member which is installed at least in a bottom wall of the chamber lid assembly and a cover covering the heating member, said cover is composed of the material that has higher thermal conductivity than that of chamber lid assembly.

In another embodiment, a substrate processing apparatus is provided which includes a chamber lid assembly having a gas dispersing channel extending perpendicular towards the susceptor, substantially cylindrical along central axis at upper portion, tapered away from central axis at lower portion, wherein a wall partially defined the gas dispersing channel is covered by a material having higher thermal conductivity than that of chamber lid assembly, a susceptor positioned proximal to the chamber lid assembly, wherein the susceptor includes a heating member for heating the substrate, a process chamber accommodating at least the chamber lid assembly and the susceptor and a controller configured to control the heating member.

In another embodiment, a non-transitory computer-readable recording medium storing a program for manufacturing a semiconductor device is provided. The program employs a substrate processing apparatus comprising a chamber lid assembly including a first heating member, a susceptor arranged close to the chamber lid assembly, said susceptor including a second heating member for heating the substrate. The program causes a computer to execute loading a substrate to the susceptor; delivering a gas to the substrate through the chamber lid assembly, controlling the first heating member so as to reduce the conduction of heat energy generated by the second heating member from the susceptor to the chamber lid assembly and unloading the substrate from the susceptor.

In another embodiment, a method of manufacturing a semiconductor device by employing a substrate processing apparatus is provided. The substrate processing apparatus comprises a chamber lid assembly including a first heating member and a susceptor arranged close to the chamber lid assembly, said susceptor including a second heating member for heating the substrate. The method is comprised of loading a substrate to the susceptor, delivering a gas to the substrate through the chamber lid assembly, controlling the first heating member so as to reduce the conduction of heat energy generated by the second heating member from the susceptor to the chamber lid assembly and unloading the substrate from the susceptor.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

DESCRIPTION OF THE PREFERRED EMBODIMENTS (First Embodiment)

The first embodiment of this invention is provided as follows.

(Configuration of the Apparatus)

Figure 1:
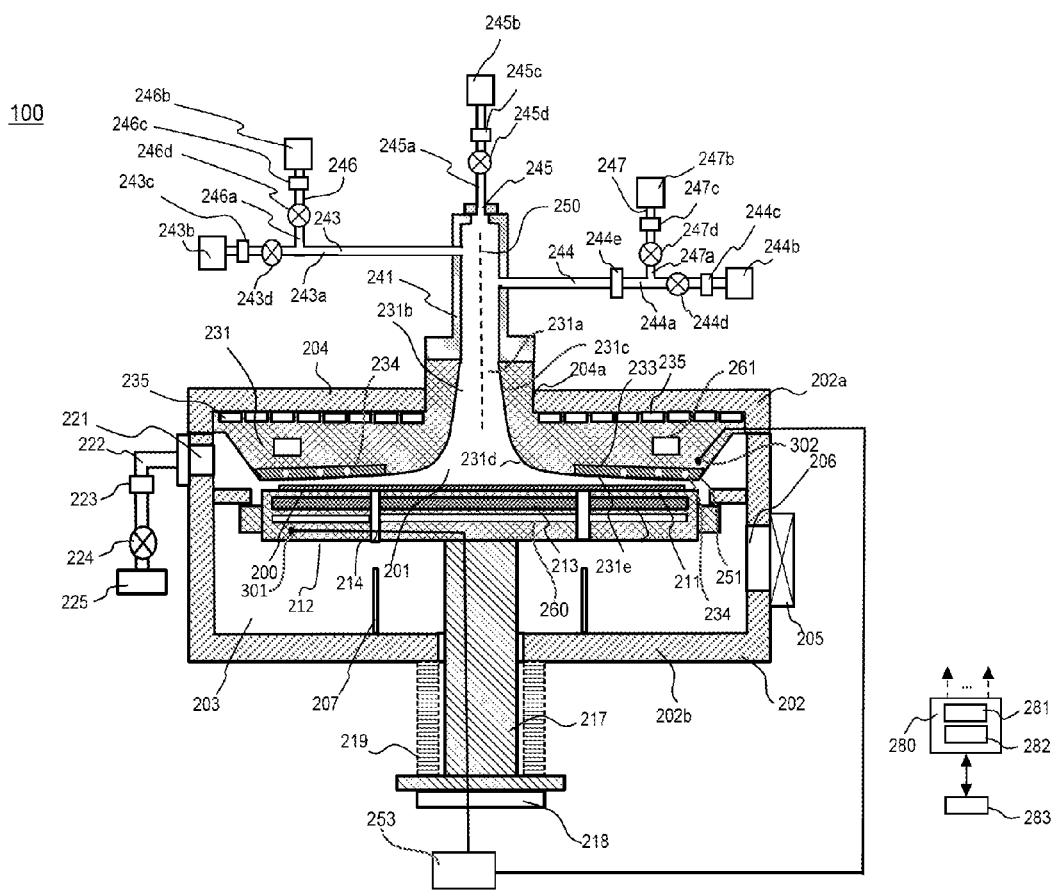
FIG. 1 is a schematic cross-sectional view of a substrate processing apparatus as described in first embodiment.

FIG. 1 is a schematic cross-sectional view of a substrate processing apparatus 100 as described in an embodiment herein. The substrate processing apparatus 100 is configured as a processing apparatus which can process just one wafer at a process as shown in FIG. 1.

(Process Chamber)

As shown FIG. 1, substrate processing apparatus 100 includes processing chamber 202. Processing chamber 202 may include the airtight container for processing substrate having a round, thin shape. And process chamber 202 contains components that may be made of aluminum (Al), stainless steel (SUS) or other suitable metal materials compatible with the processing to be performed. Processing chamber 202 forms a reaction zone 201 for processing wafer as a substrate, and transfer area 203 for transferring wafer 200 to reaction zone 201. Processing chamber 202 can be comprised of at least upper container 202 and lower container 202b.

Gate 206 for delivering or retrieving substrate may be provided at the side wall of lower container 202b. Gate 206 is coupled to gate valve 205. Wafer 200 can be delivered to or retrieved from a transfer chamber (not shown) through gate 206. A plurality of lift pins 20 can be disposed on the bottom portion of lower container 202b.

Substrate support 210 for supporting wafer 200 can be provided in reaction zone 201. Susceptor 212 may be comprised of substrate receiving surface 211 for placing wafer 200 on it, heater 213 including susceptor 212 as a second heating source and second cooling means 260 including susceptor 212 as a cooling source. Through-hole 214 is opened at the corresponding position of lift pin 207 in susceptor 212 so that lift-pin 207 can penetrate susceptor 212. Second temperature sensor 301 for detecting the temperature of outside part of susceptor 212 may be disposed under the outside part of heater 213. Second cooling means 260 for controlling the temperature of susceptor 212 may be disposed between the heater 213 and second temperature sensor 301 at the outside part of susceptor 212. A space included in susceptor 212 can work as cooling means 260 and a refrigerant like Galden® (a heating medium) may be circulating in this space.

Susceptor 212 may be supported by shaft 217. Shaft 217 may penetrate the bottom of the process chamber 202, and shaft 217 may be connected to the elevation system 218 at the outside of the process chamber 202. Wafer 200 on substrate receiving surface 211 can be raised and lowered by operating the going up and down system 218. In addition, the ambient area of the shaft 217 lower end portion may be covered by bellows 219. Process chamber 202 may be maintained airtight.

At the stage of delivering wafer 200, susceptor 212 may lower to the position where substrate receiving surface 211 may be corresponding to gate 206 for delivering or retrieving substrate (wafer delivering position). At the stage of processing wafer 200, as shown FIG. 1, wafer 200 on substrate receiving surface 211 may rise until it becomes the processing position (wafer processing position) in reaction zone 201.

Specifically, when susceptor 212 is lowered to wafer delivering position, Upper end of lift pin 207 projects from substrate receiving surface 211, then lift pin 207 comes to support wafer 200 from the lower position. When susceptor 212 is raised to wafer processing position, lift pin 207 is buried from substrate receiving surface 211, then substrate receiving surface 211 comes to support wafer 200 from the lower position. In addition, as lift pin 207 may touch wafer 200 directly, it is preferable that lift pin 207 is made of quartz or alumina and so on.

Chamber lid assembly 231, made of low heat conduction materials such as stainless steel (SUS), may be located at the upper area of reaction zone 201. Convex portion 231a of chamber lid assembly 231 may penetrate the top plate 204 through the hole 204a located the center of the top plate which configures a part of upper container 202a, then convex portion 231a can be coupled to gas delivering system described later. In addition, by using low heat conduction materials as materials of chamber lid assembly, heat energy generated by heater 234 described later may be hard to conduct top plate 204 or gas conduits.

Gas dispersing channel 231b may be defined at a central portion of chamber lid assembly 231 and may be defined from convex portion 231a to lower portion of chamber lid assembly 231. Gas dispersing channel 231b may let gas go through from a gas supplying system to reaction zone 201. Horizontal diameter defined by side wall 231c of gas dispersing channel 231b may spread gradually towards the lower portion so as to deliver gases to wafer 200 uniformly. Gas dispersing channel 231b may extend perpendicular towards substrate receiving surface 211 and also extend along central axis 250 of gas dispersing channel 231b, through chamber lid assembly 231, and to bottom wall 231e. In one example, a portion of gas dispersing channel 231b may be substantially cylindrical along central axis 250 at upper portion 241. In other example, a part of side wall 231c which partially defines gas dispersing channel 231b at lower portion 231d, may taper away from central axis 250. Gas dispersing channel 231b may further extend past lower portion 231d and into reaction zone 201. Bottom wall 231e extends from lower portion 231d of gas dispersing channel 231b to choke 251. Choke 251 can regulate a gas flow from reaction zone 201 to the exhaust system exhausting an atmosphere of process container 202. In one embodiment, under the condition that susceptor 212 is positioned at the process position in reaction zone 201, the smallest spacing between bottom wall 231e and substrate receiving surface 211 on susceptor 212, is between about 0.02 inches and about 2.0 inches, and preferably between 0.02 inches and about 0.2 inches. The spacing may vary depending on the gases being delivered and the process conditions including the consideration of heat conduction between bottom wall 231e and susceptor 212 during deposition.

Cover 233 may be mounted on at least bottom wall 231e which partially defines gas dispersing channel 231b in chamber lid assembly 231. Cover 233 may be generally or partially made of a material having a thermal conductivity higher than that of the ambient part of chamber lid assembly 231. For example, cover 233 may be made of aluminum having a thermal conductivity of 236 W m$^{-1}$ K$^{-1}$, higher than that of stainless steel. In here, thermal conductivity of aluminum which may be a material of cover 233 is 236 W m$^{-1}$ K$^{-1}$. In contrast, thermal conductivity of stainless steal which may be a material of chamber lid assembly 231 is from 16.7 W m$^{-1}$ K$^{-1}$ to 20.9 W m$^{-1}$ K$^{-1}$. Therefore, thermal conductivity of cover 233 is higher than that of chamber lid assembly 231.

Heater 234 as second heating means may be arranged within cover 233. Heater 234 may include one heater element or a plurality of heater elements. As controlling the temperature partially or individually, corresponding to each element of heater in cover 233, a plurality of heater elements is preferable. First temperature sensor 302 may be disposed close to heater 234 so as to detect the temperature of bottom wall 231e.

In another embodiment, heater 234 may not need to be put in cover 233. Without heater 234 arranged within cover 233, merely covering bottom wall 231e with cover generally or partially made of a material having a thermal conductivity is higher than that of the ambient part of chamber lid assembly 231, side wall 231c, lower portion 231b or bottom wall 231e are heated uniformly. Therefore, the film consistency may be more uniform. The film being hard to come off may be formed.

In these embodiments, cover 233 may be formed by depositing or coating a material such as aluminum, which thermal conductivity is higher than that of the ambient part of chamber lid assembly onto at least bottom wall 231e. The configurations of cover 233 may include not only mounting some physical members having high thermal conductivity on at least bottom wall 231e but also depositing or coating a material having high thermal conductivity on at least bottom wall 231e.

In addition, first cooling means 261 may be included in chamber lid assembly 231, A space included in chamber lid assembly 231 can work as cooling means 261 and a refrigerant like Galden® (a heating medium) may be circulating in this space.

At the part that chamber lid assembly 231 contacted to a top plate 204, thermal attenuation part 235 comprised of a space or other gap filled with appropriate refrigerant may be disposed along the surface of top plate 204. Thermal attenuation part 235 may attenuate heat energy generated with heater 234, so as not to conduct valves of gas supply system through chamber lid assembly 231 or top plate 204. The durability of the valve may become remarkably low when a valve may be exposed to a high temperature. The life time of the valve can be extended by disposing the thermal attenuation part.

(Gas Delivery System)

Upper portion 241 may be in communication with convex portion 231a in gas dispersing channel 231b of chamber lid assembly 231. A flange of upper portion 241 and a top surface of convex portion 231a are fixed with screws etc. not illustrated. At least two gas delivery lines are coupled with a side wall of upper portion 241.

First gas delivery line 243a and second gas delivery line 244a may be coupled with upper portion 241. Second gas delivery line 244a may be coupled with upper portion 241 through remote plasma unit 244e.

A gas containing first element may be mainly delivered through first gas delivery system 243 including first gas delivery line 243a and a gas containing second element may be mainly delivered through second gas delivery system 244 including second gas delivery line 244a. When a wafer is processed, an inert gas may be delivered through third gas delivery system 245 including third gas delivery line 245a.

(First Gas Delivery System)

In first gas delivery line 243a, source of first gas 243b, mass flow controller (MFC) 243c which is flow quantity controller (flow quantity control part) and valve 243d which is an on-off valve are sequentially arranged from the upstream of the gas delivery line.

Gas which contains first element (gas containing first element, hereafter) may be delivered from source of first element 243b to reaction zone 201 through mass flow controller 243c, valve 243d and first gas delivery line 243a.

Gas containing first element is a source gas, that is one of the process gases. If the first element can be assumed hafnium (Hf) here, gas containing first element is a gas containing hafnium. In addition, the first element may be solid, liquid or gas under the ordinary temperature and normal pressure. In case that the first element is a liquid under the ordinary temperature and normal pressure, a vaporizer (not illustrated) can be disposed between source of the first element 243b including such a liquid source and mass flow controller 243c. In this embodiment, the first element is a gas under ordinary temperature and normal pressure.

Down stream edge of first inert gas delivery line 246a is connected downstream of valve 243d of first gas delivery line 243a. In first inert gas delivery line 246a, source of inert gas 246b, mass flow controller (MFC) 246c which is flow quantity controller (flow quantity control part) and valve 246d which is an on-off valve are sequentially arranged from the upstream of the inert gas delivery line.

For example, an inert gas is nitrogen (N$_2$) gas. In addition, other than N$_2$ gas, the rare gas such as helium (He) gas, neon (Ne) gas, the argon (Ar) gas can be used for an inert gas, too.

First gas delivery system 243 (For example, gas containing hafnium delivery system) may mainly include first gas delivery line 243a, mass flow controller (MFC) 243c and valve 243d.

In addition, first inert gas delivery system 246 can mainly include first inert gas delivery line 246a, mass flow controller (MFC) 246c and valve 246d. Source of inert gas 246b and first gas deliver line 243a may be included in first inert gas delivery system 246.

In addition, source of the first element 243b and first inert gas delivery system 246 may be included in first gas delivery system 243.

(Second Gas Delivery System)

Remote plasma unit 244e may be disposed downstream of second gas delivery line 244a. In the upper stream of that delivery line, source of second gas 244b, mass flow controller (MFC) 244c which is flow quantity controller (flow quantity control part) and valve 244d which is an on-off valve are sequentially arranged from the upstream of the gas delivery line.

Gas which contains second element (gas containing second element, hereafter) may be delivered from source of second gas 244b to reaction zone 201 through mass flow controller 244c, valve 244d, second gas delivery line 244a, remote plasma unit 244e and upper portion 241.

In case that delivering second gas with radicals activated by plasma to reaction zone 201, remote plasma unit 244e may be disposed in second gas delivery line 244a. The second gas via remote plasma unit 244e may include radicals which activated by plasma. The second gas with radicals may be supplied on wafer 200.

Gas containing second element may be one of the process gases. In addition, gas containing second element may be a reactant gas or a gas which can convert the characteristics of the films formed on wafer 200.

The gas containing second element may contain the second element being different from the first element. For example, the second element can be selected from one of oxygen (O), nitrogen (N) or carbon (C). In this embodiment, the gas containing second element can be oxygen containing gas. Specifically, oxygen ($O_2$) gas can be used as oxygen containing gas.

Gas containing second element delivery system 244 (For example, oxygen containing gas delivery system) may mainly include second gas delivery line 244a, mass flow controller (MFC) 244c and valve 244d.

Down stream edge of second inert gas delivery line 247a is connected to downstream than valve 244d of second gas delivery line 244a. In second inert gas delivery line 247a, source of inert gas 247b, mass flow controller (MFC) 247c which is flow quantity controller (flow quantity control part) and valve 247d which is an on-off valve are sequentially arranged from the upstream of the inert gas delivery line.

An inert gas is delivered from source of inert gas 247b to reaction zone 201 through mass flow controller 247c, valve 247d, second gas delivery line 244a and remote plasma unit 244e. The inert gas may act as carrier gas or dilution gas in the thin film formation process (S104).

Second inert gas delivery system may mainly include second inert gas delivery line 247a, mass flow controller (MFC) 247c and valve 247d. In addition, source of inert gas 247b, second gas delivery line 244a and remote plasma unit 244e can be included in second inert gas delivery system.

In addition, source of second gas 244b, remote plasma unit 244e and second inert gas delivery system can be included in gas containing second element delivery system 244.

(Third Gas Delivery System)

In third gas delivery line 245a, source of third gas 245b, mass flow controller (MFC) 245c which is flow quantity controller (flow quantity control part) and valve 245d which is an on-off valve are sequentially arranged from the upstream of the gas delivery line.

An inert gas as a purge gas may be delivered from source of third gas 245b to reaction zone 201 through mass flow controller 245c, valve 245d and third gas deliver line 245a.

For example, an inert gas is nitrogen ($N_2$) gas. In addition, other than $N_2$ gas, the rare gas such as helium (He) gas, neon (Ne) gas and argon (Ar) gas may be employed for an inert gas.

Third gas delivery system 245 may mainly include third gas delivery line 245a, mass flow controller (MFC) 245c and valve 245d.

In a substrate processing process, an inert gas may be delivered from source of third gas 245b to reaction zone 201 through mass flow controller 245c, valve 245d and third gas deliver line 245a.

In a substrate processing process, an inert gas delivered from source of third gas 245b may act as a purge gas which may purge the gases remaining in process container 202 or chamber lid assembly 231.

(Exhaust System)

The exhaust system exhausting an atmosphere of process container 202 may include exhaust conduit 222 connected to exhaust outlet 221 arranged in the sidewall of reaction zone 201. Exhaust conduit 222 can include APC (auto pressure controller) 223 for controlling the pressure in reaction zone 201 in a predetermined pressure. APC 223 can have a valve body with adjustable opening (not illustrated) and can control a conductance in exhaust conduit 222 according to the indication from a controller mentioned later. Valve 224 is disposed downstream of APC 223 in exhaust conduit 222. Pump 225 is connected downstream of valve 224. Exhaust system can include exhaust conduit 222, APC 223 and valve 224. Exhaust system may also include pump 225.

(Temperature Comparator)

The output of first temperature sensor 302 and second temperature sensor 301 may be connected to temperature comparator 253 so as to compare those output signals. Temperature comparator 253 is electrically connected to the controller 280, as will be explained later. Temperature data output from first temperature sensor 302 and second temperature sensor 301 may input to temperature comparator 253, then temperature comparator 253 may analyze whether heat conduction between susceptor 212 and chamber lid assembly 231 may occur intensely, based on the difference the temperature detected by first temperature sensor 302 and the temperature detected second temperature sensor 301. The effect of the analysis may output to controller 280. In case that there may be a serious temperature difference in the heat conduction between susceptor 212 and chamber lid assembly 231, controller 280 may relatively control the heat quantities of heater 212 embedded in susceptor 212 or heater 234 embedded in chamber lid assembly 231.

In another embodiment, temperature comparator 253 may compare the output of first temperature sensor 302 embedded in chamber lid assembly 231 with a predetermined value, not the temperature data output from second temperature sensor 301 embedded in susceptor 212. As the temperature of the susceptor 212 may be identified by the process, controller 280 may only control the calorific value of heater 234 embedded in chamber lid assembly 231 so as not to conduct heat energy from susceptor 212 to chamber lid assembly 231.

(Controller)

Substrate processing apparatus 100 may have controller 280 controlling the operation of each part of substrate processing apparatus 100. Controller 280 may have at least arithmetic logical unit 281 and memory unit 282. Controller 280 can be connected with each element mentioned above. According to the indication of the further host controller or an operator, controller 280 can load specified programs or recipes from memory unit 282 to execution memory and control operations of substrate processing apparatus 100 according to the contents of programs or recipes.

In addition, controller 280 may constitute an exclusive computer and may constitute it as a general-purpose computer.

In one embodiment, controller 280 can be constituted by a general-purpose computer which includes external memory 283 installing above mentioned program. As external memory 283, there can be a magnetic tape, a magnetic disk such as a flexible disc or a hard disk, optical disk such as a CD or a DVD, a magneto-optical disk such as an MO or a semiconductor memory included in such as a USB memory (USB Flash Drive) or the memory card etc.

In addition, the means to install the program to a computer are not limited to the means supplying it through external memory 283. For example, installing the program by using the means of communications such as the Internet or the exclusive line, without external memory 283, can be possible.

In addition, memory unit 282 or external memory 283 are comprised as the recording medium that computer reading is possible. Merely recording medium means these memories collectively. When the terminology recording medium is used hereinafter in this specification, the terminology is defined as just the memory unit 282, external memory 283 or both of memory unit 282 and external memory 283.

In this embodiment, temperature comparator 253 may be described as separated configuration from controller 280, but temperature comparator 253 may be included in controller 280 as one of its functions. In this case, the outputs of first and second temperature sensor 302, 301 may connected to controller 280 electrically.

In another embodiment, the controller may be configured to compare first temperature information output by the first temperature sensor with the predetermined value identified by a process and to control an electrical power to feed to the first heating member or the second heating member so that the difference between the temperature of bottom wall of chamber lid assembly and the predetermined value identified by a process can be within a predetermined range of temperature.

By the way, in the apparatus having a gas dispersion channel 231b having a diameter which spreads so as to get closer to wafer 200 like this embodiment, it was difficult to equalize the temperature in the surface of the wafer 200.

The reason for non-uniformity of the wafer temperature may be that there is bottom wall 231e of chamber lid assembly 231 close to outside part of wafer 200 on susceptor 212 and there is a relatively large space between a side wall 231d of chamber lid assembly 231 and center part of wafer 200 on susceptor 212. Wafer 200 is heated with heater 213, but the heat of outside part of wafer 200 may be conducted to bottom wall 231e having lower temperature. Therefore the temperature of outside part of wafer 200 may become lower than that of center part of wafer 200.

Therefore, in one embodiment, bottom wall 231e includes heater 234. More specifically, heater 234 may be embedded in bottom wall 231e in chamber lid assembly 231, corresponding to the outside part of wafer 200 on susceptor 212. Heater 234 may covered by cover 233.

As heater 234 can be positioned and held within the part close to the bottom of chamber lid assembly 231, the temperature of bottom wall 231e can be high. Then heat conduction from outside part of wafer 200 to bottom wall 231e can be restrained. Besides, as heater 234 may be embedded in cover 233 generally or partially made by the material being high thermal conductivity, the heat generated by heater 234 may spread through the cover uniformly. Therefore, the temperature of bottom wall 231e may be generally equalized. Due to uniformity of temperature at bottom wall 231e, the quantity that heat conducts may be controlled uniformly.

(Substrate Processing Process)

Next, by employing substrate processing apparatus 100, a process forming a thin film on wafer 200 is explained. The operations of all parts constituting substrate processing apparatus 100 may be controlled by controller 280.

Figure 2:
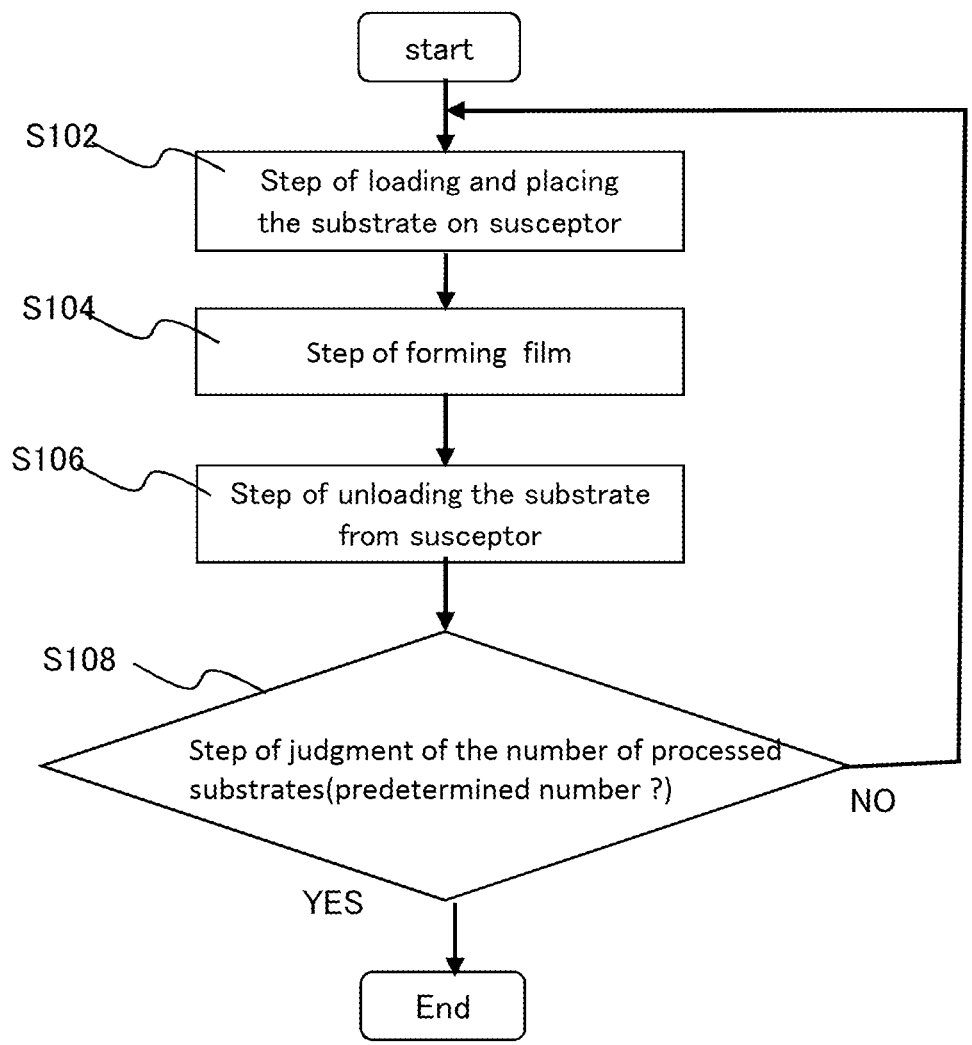
FIG. 2 is a flowchart for explaining a substrate processing process as shown in FIG. 1.
Figure 3:
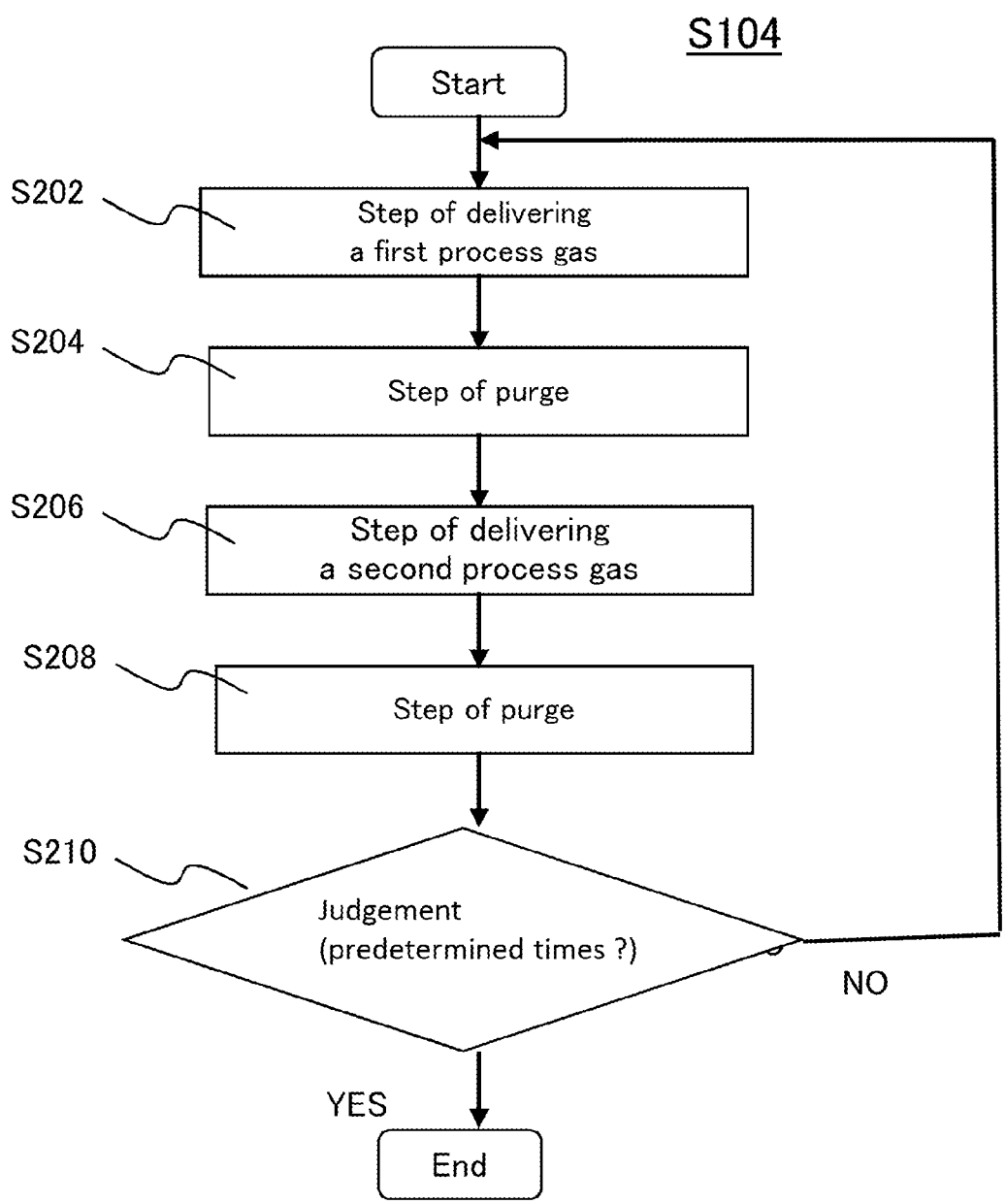
FIG. 3 is a flowchart for explaining the detailed process for forming film as shown in FIG. 2.

FIG. 2 is a flowchart for explaining a substrate processing process in this embodiment. FIG. 3 is a flowchart for explaining the detailed process for forming film explained in FIG. 2.

Using a TEMAH (tetrakisethylmethylamino hafnium, Hf(NEtMe)$_4$) as a gas containing first element and a steam (H$_2$O) or an ozone (O$_3$) as a gas containing second element, a process to form a hafnium oxide film is explained as follows.

(Step of Loading and Placing the Substrate on Susceptor S102)

In the step of loading and placing substrate on susceptor, firstly, by letting susceptor 212 lower to the wafer delivering position, lift pin 207 may penetrate through-hole 214 in susceptor 212. As a result, upper end of lift pin 207 projects for predetermined length from substrate receiving surface 211 on susceptor 212. Next, by opening gate valve 205, an atmosphere may be communicated between transfer area 203 and a loading area (not illustrated). Wafer 200 can be transferred from the loading area to transfer area 203 by using wafer handling robot (not illustrated) and be set on upper end of lift pin 207. In this way, wafer 200 can be supported in a horizontal position on upper end of lift pin 207 projected from substrate receiving surface 211 on susceptor 212.

After wafer 200 is transferred by the wafer handling robot to process container 202, the wafer handling robot can be left outside process container 202 and thereafter, process container 202 can be sealed by closing gate valve 205. Then, wafer 200 may be placed on substrate receiving surface on susceptor 212 by raising susceptor 212. Furthermore, wafer 200 may be raised to the process position in reaction zone 201 which mentioned above by raising susceptor 212.

When wafer 200 is placed on susceptor 212, by supplying electrical power to heater 213 buried in susceptor 212, the temperature on the surface may be controlled so that it is within a predetermined range of temperature. For example, the temperature of wafer 200 may be maintained more than a room temperature and less than 500 degrees Celsius, preferably more than a room temperature and less than 400 degrees Celsius.

In this case, the temperature of heater 213 can be controlled by the rate of feed of the electric power to heater 213, based on temperature information detected by temperature sensor (not illustrated). The temperature of heater 213 may be controlled continuously from the step of loading and placing the substrate on susceptor S102 to the step of unloading the substrate S106 described later.

Furthermore, an electric power may be fed to heater 234 embedded in cover 233 in bottom wall 231e. And the temperature of cover 233 may be controlled so that it may be maintained within a predetermined temperature range. For example, the predetermined temperature range of heater 234 may be including the temperature of substrate receiving surface 211. By setting the target temperature of the heater 234 embedded in cover 233 to the temperature of substrate receiving surface 211, heat conduction between outside part of the substrate receiving surface 211 and bottom wall 231e may be restrained. The temperature of heater 213 may be controlled continuously from the step of loading and placing the substrate on susceptor S102 to the step of unloading the substrate S106 described later.

In addition, heater 234 may be embedded directly near bottom wall 231e of chamber lid assembly 231 without employing cover 233. In other word, by decreasing the difference between the temperature of outside part of the substrate receiving surface 211 and temperature of bottom wall 231e of chamber lid assembly 231, heat conduction between outside part of the substrate receiving surface 211 and bottom wall 231e can be restrained. Cover 233 may not be an essential element in this embodiment.

In this embodiment, a substrate processing apparatus includes a first heater 234 configured to heat at least bottom wall 231e of chamber lid assembly 231, a first temperature sensor 302 configured to detect the temperature of bottom wall 231e of chamber lid assembly 231, a second heater 213 configured to heat outside part of the substrate receiving surface 211, a second temperature sensor 301 configure to detect temperature of the outside part of the substrate receiving surface 211, temperature comparator 253 configured to compare first temperature information output by said first sensor 302 for detecting the temperature of bottom wall 231e of chamber lid assembly 231 with second temperature information output by said second temperature sensor 301 for detecting the temperature of the outside part of the substrate receiving surface 211 and a controller 280 configured to control an electrical power to feed to the heater for heating outside part of the substrate receiving surface 211 or to control an electrical power to feed to the heater for heating bottom wall 231e so that the difference between the temperature of the outside part of the substrate receiving surface 211 and that of bottom wall 231e of chamber lid assembly 231 can be decreased.

Furthermore, to reduce a difference between the temperature of outside part of the substrate receiving surface 211 and that of bottom wall 231e of chamber lid assembly 231 by controlling more finely the temperature of outside part of the substrate receiving surface 211 and temperature of bottom wall 231e of chamber lid assembly 231, a cooling means 261 such as a conduit circulating a refrigerant in it may be embedded in outside part of the substrate receiving surface 211 or bottom wall 231e of chamber lid assembly 231.

Furthermore, to improve thermal uniformity at bottom wall 231e, it is preferable that cover 233 may be mounted on bottom wall 231e.

Controller 280 may control an electrical power feeding to the heater so that the difference between the temperature of outside part of the substrate receiving surface 211 and that of bottom wall 231e of chamber lid assembly 231 can be lower. In addition, controller 280 may also control a flow late of the refrigerant in cooling means 261. Therefore, controller 280 can restrain the difference between the temperature of outside part of the substrate receiving surface 211 and that of bottom wall 231e of chamber lid assembly 231 more precisely, then heat conduction between outside part of the substrate receiving surface 211 and bottom wall 231e can be lower.

In addition, side wall 231b or lower portion 231d of gas dispersion channel 231b may also include the heaters and/or the cooling means 261. The temperature of side wall 231b or lower portion 231d may be also controlled by controller 280 so that a deposited film has desired thickness or characteristic. By incorporating the control of the temperature of the surface of chamber lid assembly 231 into the control of the temperature of susceptor 212, the temperature of wafer 200 may be controlled almost in the whole area of wafer 200. Under the condition that temperatures across the entire area of wafer 200 are controlled uniformly, a film having uniform thickness or characteristics can be formed in the whole area of wafer 200.

On the other hand, depending on the requirements of the process including etching process after forming the film by employing this apparatus, intentionally forming a film having different thickness or characteristics at specific parts of wafer 200 may be possible. For example, by raising the temperature of outside part of the substrate receiving surface 211 or the temperature of the surface of chamber lid assembly 231 which is faced to gas dispersing channel 231b, the surface reaction of outside part of wafer 200 may be more activated, therefore the film thickness formed on outside part of wafer 200 can be thickened, quality of formed film on it can be made better than the center part of wafer 200 or characteristics of film formed on outside part of wafer 200 can be made different from characteristics of film formed on the center part of wafer 200.

(Step of Forming Film S104)

Next, step of forming film S104 is performed. With reference to FIG. 3, step of forming film S104 is explained in detail. In one embodiment, step of forming film S104 may be a cyclic process repeating a process with delivering a plural of process gases alternately.

(Step of Delivering a First Process Gas S202)

When the temperature of wafer 200 reaches the predetermined temperature by heating around wafer 200, valve 243d arranged in first gas delivery system 243 may be opened, then the flow rate of the TEMAH gas may be adjusted to the predetermined rate by using mass flow controller 243c. For example, the flow rate of the TEMAH gas may be from 100 sccm to 5000 sccm.

At this time, valve 224 may open so that a pressure of reaction zone 201 can be controlled to a predetermined pressure by APC 223.

At the same time, valve 245d in third gas delivery system 245 may be opened, nitrogen ($N_2$) gas may be delivered through third gas deliver line 245a. Nitrogen ($N_2$) gas may also be delivered through first inert gas delivery system 246. In addition, prior to this step, delivering nitrogen gas ($N_2$) may be started from third gas deliver line 245a.

The TEMAH gas delivered to process container 202 may be supplied on wafer 200. A layer containing hafnium as a layer containing the first element may be formed in the surface of wafer 200 by adsorbing or depositing the TEMAH gas on wafer 200.

Depending on a pressure in process container 202, a flow rate of the TEMAH gas or a temperature of susceptor 212, the layer containing hafnium may be formed by predetermined thickness, characteristics and distributions. In addition, before this film formation, predetermined film or predetermined film with specific pattern may be formed on wafer 200.

After predetermined time has passed after start of delivering the TEMAH gas, delivering the TEMAH gas may be stopped by closing valve 243d.

(Step of Purge S204)

Next, reaction zone 201 may be purged by delivering a nitrogen ($N_2$) gas through third gas deliver line 245a. As valve 224 may also open, a pressure of reaction zone 201 may be controlled to predetermined pressure by APC 223. In this way, the TEMAH gas which was not able to be adsorbed on the surface of wafer 200 in the step of delivering a first process gas S202 may be removed from reaction zone 201 through exhaust conduit 222.

When purging of reaction zone 201 is finished, pressure control by APC 223 may be restarted under the condition that valve 224 is open.

(Step of Delivering a Second Process Gas S206)

After the step of purging S204, valve 244d of second gas delivery line 244a may open so as to deliver an oxygen containing gas to reaction zone 201. In this embodiment, an ozone ($O_3$) gas is used as an oxygen gas.

At this time, the flow rate of an oxygen gas may be adjusted to the predetermined rate by using mass flow controller 244c. For example, the flow rate of an oxygen gas is from 100 sccm to 5000 sccm. Nitrogen ($N_2$) gas as a carrier gas can be delivered through second inert gas deliver line 245a. a nitrogen ($N_2$) gas may also be delivered through second inert gas delivery system 247 with delivering oxygen gas. In addition, in this process, valve 245d in third gas delivery system 245 may be opened, nitrogen (N$_2$) gas may be delivered through third gas deliver line 245a.

The oxygen gas may be delivered on wafer 200. The layer containing hafnium which has been already formed in the step of delivering a first process gas S202 may be converted by the oxygen gas. Thus, the layer containing a hafnium element and an oxygen element may be formed on wafer 200.

For example, according to the pressure in reaction zone 201, the flow rate of nitrogen (N$_2$) gas or the temperature of susceptor 212 during the process, a converted layer which contains an oxygen element in hafnium layer may be formed of desired thickness, distributions of oxygen elements in hafnium oxide film or the invasive situation of an oxygen element to the layer containing hafnium.

After a predetermined time has passed, delivering the oxygen gas may be stopped by closing valve 244d.

In the step of delivering a first process gas S202, like S202 mentioned above, valve 224 may open so that a pressure in reaction zone 201 may be controlled to a predetermined pressure by APC 223.

(Step of Purge S208)

Next, the step of purging S208 like S204 is practiced. The explanation is skipped because the operation is similar to what it was explained in S204.

(Judgment S210)

Controller 280 may judge whether the processes mentioned above was repeated a predetermined number of times (n cycles).

When a predetermined number of times is not carried out (in the case of No in S210), the step of delivering a first process gas S202, the step of purge S204, the step of delivering a second process gas S206 and the step of purging S208 may be repeated. When a predetermined number of times was carried out (in the case of Yes in S210), a process shown in FIG. 3 is finished.

When we return to explanation using FIG. 2, the next step of unloading the substrate from susceptor S106 is carried out.

(Step of Unloading the Substrate from Susceptor S106)

In the step of unloading the substrate from susceptor S106, by letting susceptor 212 lower to the wafer delivering position, wafer 200 may be supported in a horizontal position on upper end of lift pin 207 projected from substrate receiving surface 211 on susceptor 212. In this way, wafer 200 is located from at the processing position to at the wafer delivering position. Then, gate valve 205 may be opened and wafer 200 may be unloaded to the out of process container 202 through the opened gate valve 205 by using wafer handling robot (not illustrated). Valve 245d may be closed and delivering an inert gas from third gas delivery system 245 to process container 202 may be restrained.

(Step of Judgment of the Number of Processed Substrates S108)

After unloading wafer 200, controller 280 may judge whether the step of forming film S104 has repeated a predetermined number of times or not. When the step of forming film S104 has executed the predetermined number of times, a series of processes are finished.

Second Embodiment

Figure 4:
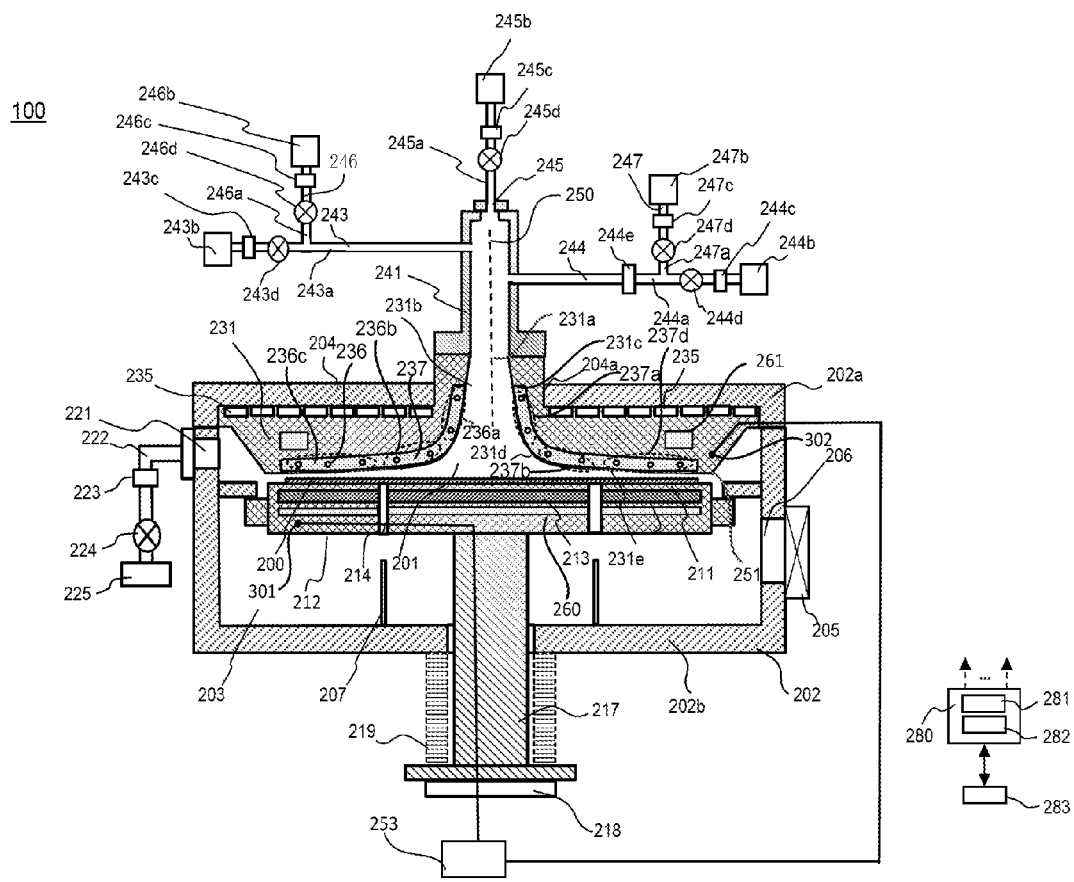
FIG. 4 is a schematic cross-sectional view of a substrate processing apparatus as described in second embodiment.

Referring to FIG. 4, the second embodiment is explained. In the second embodiment, configurations of heaters included in chamber lid assembly 231 may be different from those in the first embodiment. More specifically, heaters may be included in bottom wall 231e, lower portion 231d or side wall 231c in this embodiment. Mainly on differences with the first embodiment, the second embodiment is explained below.

Heater 236a may be included in side wall 231c of chamber lid assembly 231, heater 236b may be included in lower portion 231d of chamber lid assembly 231 and heater 236c may be included in bottom wall 231e of chamber lid assembly 231. A calorific value of each heater 236a, 236b, 236c may be controlled by controller 280 independently. Heater 236a, heater 236b and heater 236c are collectively called heaters 236 or first heating members.

While a gas is delivered to reaction zone 201, controller 280 may control the calorific value of heater 236a so that a film may be formed at side wall 231c. While a gas is delivered to reaction zone 201, controller 280 may control the calorific value of heater 236b so that a film may be formed at lower portion 231d. While a gas is delivered to reaction zone 201, controller 280 may control the calorific value of heater 236c so that the difference between the temperature of outside part of the substrate receiving surface 211 and that of bottom wall 231e of chamber lid assembly 231 can be decreased like the first embodiment.

Considering the configuration without heater 236a or heater 236b, heat conduction from heater 234 embedded directly in bottom wall 231e to lower portion 231d or side wall 231c may be possible. Under such an unintentional heating, heating side wall 231c or lower portion 231d uniformly to a desired temperature may be difficult because there may be an irregularity of the consistency of the material of chamber lid assembly 231.

Irregularity of the temperature of wafer 200 corresponding to the part put below side wall 231c and lower part 231d, materials included in the gas delivered in reaction zone 201 may be deposited or adsorbed ununiformly on wafer 200 under the irregularity of the temperature of it.

As materials may be deposited or adsorbed ununiformly on wafer 200, film consistency or membrane stress may be irregular. As a result, the film may come off easily and the film which came off may become a reason for yield loss.

Therefore, in this embodiment, heater 236a may be included in side wall 231c or heater 236b may be included in lower portion 231d. At least one of heater 236a or heater 236b may be included. Under such a configuration, side wall 231c and/or lower portion 231d may be heated uniformly. Thus, film flakes may be restrained.

It is preferable that each heater may be embedded in cover 237 generally or partially made by the material being high thermal conductivity like Aluminum. As cover 237 generally or partially made by the material having high thermal conductivity may spread the heat generated by heater 236a or heater 236b uniformly, side wall 231c or lower portion 231d may be heated uniformly. Therefore, the film consistency may be more uniform. The film being difficult to come off may be formed.

By the way, when cover 237a of side wall 231c, cover 237b of lower portion 231d and cover 237c of bottom wall 231e are disposed respectively, Some gases may cling to a joint line of the covers and may generate the turbulence near the joint line and byproduct may generate at this joint line. Therefore feed of the gas may not be uniform, and a yield loss might occur.

Therefore, in this embodiment, it is preferable that cover 237a of side wall 231c, the cover 237b of lower portion 231d or cover 237c of bottom wall 231e may be mounted without joint lines.

In addition, the outside edge of the cover 237c of bottom wall 231e may be arranged further out than the corresponded outside edge of wafer 200 so as to control the temperature of the outside part of wafer 200. The element of the heater 236c may also be included in the cover 237c which protrudes outward from the outside edge of the wafer 200.

In this embodiment, each heater may be disposed independently in side wall 231b, lower portion 231d or bottom wall 231e. Arrangement of the heaters is not limited to this arrangement, heaters 236 are disposed continuously from bottom wall 231e of chamber lid assembly 231 to side wall 231b via lower portion 231d, not limited to be disposed only at the position of bottom wall 231e. Similarly, in the case of embedding cooling means 261, cooling means 261 may be disposed continuously from bottom wall 231e of chamber lid assembly 231 to side wall 231b via lower portion 231d, not limited to being disposed only at the position of bottom wall 231e. Arrangement of the cooling means 261 is not limited to this arrangement, each cooling means 261 may be disposed independently in side wall 231b, lower portion 231d or bottom wall 231e.

When heaters 236 or cooling means 261 are disposed in side wall 231b, lower portion 231d or bottom wall 231d independently, the temperature of the surface of chamber lid assembly 231 may be controlled independently and partially.

(Substrate Processing Process)

Next, by employing substrate processing apparatus 100, a process forming a thin film on wafer 200 is explained. The substrate processing process in this embodiment is approximately similar to the first embodiment but controlling the calorific value of heater 236a, heater 236b or heater 236c electrically may be started in the step of loading and placing the substrate on susceptor S102. Therefore, only differences between the first embodiment and this embodiment are explained concretely and explanations regarding similar points may be partially omitted. In following explanations, the operations of all parts constituting the substrate processing apparatus 100 may be controlled by controller 280.

FIG. 2 is a flowchart for explaining a substrate processing process in this embodiment. FIG. 3 is a flowchart for explaining the detailed process for forming film explained in FIG. 2.

Using a TEMAH (tetrakisethylmethylamino hafnium, Hf(NEtMe)$_4$) as a gas containing first element and a steam (H$_2$O) or an ozone (O$_3$) as a gas containing second element, a process to form a hafnium oxide film is explained as follows.

(Step of Loading and Placing the Substrate on Susceptor S102)

Wafer 200 may be placed on lift pin 207 by similar way described in first embodiment.

In this way, wafer 200 can be supported in a horizontal position on upper end of lift pin 207 projected from substrate receiving surface 211 on susceptor 212. Thereafter, wafer 200 may be placed on substrate receiving surface on susceptor 212 by raising susceptor 212. Furthermore, wafer 200 may be raised to the process position in reaction zone 201.

When wafer 200 is placed on susceptor 212, by supplying electrical power to heater 213 buried in susceptor 212, the temperature on the surface may be controlled so that it is within a predetermined range of temperature. For example, the temperature of wafer 200 may be maintained more than a room temperature and less than 500 degrees Celsius, preferably more than a room temperature and less than 400 degrees Celsius.

In this case, the temperature of heater 213 may be controlled by the rate of feed of the electric power to heater 213, based on the temperature information detected by second temperature sensor 301. The temperature of heater 213 may be controlled continuously from the step of loading and placing the substrate on susceptor S102 to the step of unloading the substrate S106 described later.

Furthermore, electric powers may be fed to heater 236a, heater 236b or heater 236c embedded in cover 233. Therefore, the temperature of cover 233 may be controlled so that it may be maintained within a predetermined temperature range. For example, the predetermined temperature range of bottom wall 231e may include the temperature of substrate receiving surface 211. By setting the target temperature of bottom wall 231e to the temperature of substrate receiving surface 211, heat conduction between outside part of the substrate receiving surface 211 and bottom wall 231e may be restrained. The temperature of heaters 236 may be controlled continuously from the step of loading and placing the substrate on susceptor S102 to the step of unloading the substrate S106 described later.

In addition, heaters 236 may be embedded directly near bottom wall 231e of chamber lid assembly 231 without employing cover 233.

In brief, the temperatures of side wall 231c, lower portion 231b or bottom wall 231 should be able to be controlled so that there is no film flakes caused ununiformity of film consistency or membrane stress. Cover 233 may not be an essential element in this embodiment.

But it is desirable to use cover 233 when side wall 231c, lower portion 231b or bottom wall 231e are heated uniformly by using cover 233.

In addition, side wall 231b or lower portion 231d of gas dispersion channel 231b may also include the heaters and/or the cooling means 261. The temperature of side wall 231b or lower portion 231d may be also controlled by controller 280 so that a deposited film has desired thickness or characteristic. By incorporating the control of the temperature of the surface of chamber lid assembly 231 into the control of the temperature of susceptor 212, the temperature of wafer 200 may be controlled almost in the whole area of wafer 200. Under the condition that temperatures in the whole area of wafer 200 are controlled uniformly, a film having uniform thickness or characteristics can be formed in the whole area of wafer 200.

(Step of Forming Film S104)

Next, step of forming film S104 is performed. With reference to FIG. 3, the step of forming film S104 is explained in detail. In one embodiment, the step of forming film S104 may be a cyclic process repeating a process with delivering a plural of process gases alternately.

(Step of Delivering a First Process Gas S202)

When the temperatures of wafer 200, side wall 231c, lower portion 231d or bottom wall 231e may be reached to the predetermined temperature, valve 243d may be opened, then the flow rate of the TEMAH gas may be adjusted to the predetermined rate by using mass flow controller 243c. For example, the flow rate of the TEMAH gas may be from 100 sccm to 5000 sccm.

At this time, valve 224 may open so that a pressure of reaction zone 201 can be controlled to a predetermined pressure by APC 223.

At the same time, valve 245d may be opened, nitrogen (N$_2$) gas may be delivered through third gas deliver line 245a. Nitrogen (N$_2$) gas may also be delivered through first inert gas delivery system 246. In addition, prior to this step, delivering nitrogen gas (N$_2$) may be started from third gas deliver line 245a.

The TEMAH gas delivered to process container 202 may be supplied on wafer 200. A layer containing hafnium as a layer containing the first element may be formed in the surface of wafer 200 by adsorbing or depositing the TEMAH gas on wafer 200.

Depending on a pressure in process container 202, a flow rate of the TEMAH gas or a temperature of susceptor 212, the layer containing hafnium may be formed by predetermined thickness, characteristics and distributions. In addition, before this film formation, predetermined film or predetermined film with specific pattern may be formed on wafer 200.

After predetermined time has passed after start of delivering the TEMAH gas, delivering the TEMAH gas may be stopped by closing valve 243d.

(Step of Purge S204)

Next, reaction zone 201 may be purged by delivering nitrogen ($N_2$) gas through third gas deliver line 245a. As valve 224 may also open, a pressure of reaction zone 201 may be controlled to predetermined pressure by APC 223. In this way, the TEMAH gas which was not able to be adsorbed on the surface of wafer 200 in step of delivering a first process gas S202 may be removed from reaction zone 201 through exhaust conduit 222.

When purge of reaction zone 201 is finished, pressure control by APC 223 may be restarted under the condition that valve 224 is open.

(Step of Delivering a Second Process Gas S206)

After the step of purge S204, valve 244d of second gas delivery line 244a may open so as to deliver an oxygen containing gas to reaction zone 201. In this embodiment, ozone ($O_3$) gas is used as oxygen gas.

At this time, the flow rate of oxygen gas may be adjusted to the predetermined rate by using mass flow controller 244c. For example, the flow rate of oxygen gas is from 100 sccm to 5000 sccm. Nitrogen ($N_2$) gas as a carrier gas can be delivered through second inert gas deliver line 245a. Nitrogen ($N_2$) gas may also be delivered through second inert gas delivery system 247 with delivering oxygen gas. In addition, in this process, valve 245d in third gas delivery system 245 may be opened, nitrogen ($N_2$) gas may be delivered through third gas deliver line 245a.

The oxygen gas may be delivered on wafer 200. The layer containing hafnium which has been already formed in step of delivering a first process gas S202 may be converted by the oxygen gas. Thus, the layer containing a hafnium element and oxygen element may be formed on wafer 200.

For example, according to the pressure in reaction zone 201, the flow rate of a nitrogen ($N_2$) gas or the temperature of susceptor 212 during the process, a converted layer which contains an oxygen element in hafnium layer may be formed of desired thickness, distributions of oxygen elements in hafnium oxide film or the invasive situation of oxygen element to the layer containing hafnium.

After predetermined time passed, delivering the oxygen gas may be stopped by closing valve 244d.

In the step of delivering a first process gas S202, like S202 mentioned above, valve 224 may open so that a pressure in reaction zone 201 may be controlled to a predetermined pressure by APC 223.

(Step of Purge S208)

The step of purge S208 like S204 is practiced. The explanation is skipped because the operation is similar to what it was explained in S204.

(Judgment S210)

Controller 280 may judge whether the processes mentioned above was repeated predetermined number of times (n cycles).

When predetermined number of times is not carried out (in the case of No in S210), the step of delivering a first process gas S202, the step of purge S204, step of delivering a second process gas S206 and the step of purging S208 may be repeated. When predetermined number of times was carried out (in the case of Yes in S210), a process shown in FIG. 3 is finished.

When the process was repeated predetermined number of times, a dense film may be formed at least side wall 231c or lower portion 231d. By intentionally forming such a dense film at side wall 231c or lower portion 231d, film consistency or membrane stress of the film may be uniform. As a result, the film which film flakes may not produce easily may be formed at side wall 231c or lower portion 231d.

When we return to explanation using FIG. 2, in next, the step of unloading the substrate from susceptor S106 is carried out.

(Step of Unloading the Substrate from Susceptor S106)

In the step of unloading the substrate from susceptor S106, by letting susceptor 212 drop to the wafer delivering position, wafer 200 may be supported in a horizontal position on upper end of lift pin 207 projected from substrate receiving surface 211 on susceptor 212. In this way, wafer 200 is located from at the processing position to at the wafer delivering position. Then, gate valve 205 may be opened and wafer 200 may be unloaded to the out of process container 202 through the opened gate valve 205 by using wafer handling robot (not illustrated). Valve 245d may be closed and delivering an inert gas from third gas delivery system 245 to process container 202 may be restrained.

(Step of Judgment of the Number of Processed Substrates S108)

After unloading wafer 200, controller 280 may judge whether the step of forming film S104 has repeated predetermined times or not. When the step of forming film S104 has executed the predetermined times, a series of processes are finished.

INDUSTORIAL AVAILABILITY

The present invention includes the following embodiments in addition to the apparatus or program as claimed in claims:

A substrate processing apparatus comprising:
a chamber lid assembly including a first heating member;
a susceptor positioned proximal to the chamber lid assembly, the smallest spacing between bottom wall of the chamber lid assembly and substrate receiving surface thereof is between about 0.02 inches and about 2.0 inches, and preferably between 0.02 inches and about 0.2 inches under the condition that the susceptor is positioned at the process position in reaction zone,
wherein the susceptor including a second heating member for heating the substrate;
a process chamber accommodating at least the chamber lid assembly and the susceptor; and
a controller configured to control the first heating member so as to reduce the conduction of heat energy generated by the second heating member from the susceptor to the chamber lid assembly.

A method of manufacturing a semiconductor device by employing a substrate processing apparatus comprising a chamber lid assembly including a first heating member, a susceptor positioned proximal to the chamber lid assembly, said susceptor including a second heating member for heating the substrate, the method comprising:
loading a substrate to the susceptor;

delivering a gas to the substrate through the chamber lid assembly;
controlling the first heating member so as to reduce the conduction of heat energy generated by the second heating member from the susceptor to the chamber lid assembly;
unloading the substrate from the susceptor A chamber lid assembly comprising:
a gas dispersing channel which diameter spreads through so as to get closer the lower portion;
a heating member which is installed at least in a bottom wall of the chamber lid assembly;
a cover covering the heating member, said cover is composed of the material that has higher thermal conductivity than that of chamber lid assembly.

While foregoing is directed to the preferred embodiment of the invention, other and further embodiments of the invention may be devised without departing from the basic scope thereof. For example, this invention can be applicable to forming the film except hafnium oxide film exemplified in this embodiment and other substrate processes such as a diffusion process, oxidation, nitriding. In addition, this invention is applicable to a film formation apparatus, etching equipment, oxidation processing unit, nitrided processing unit, other substrate processing unit such as a coating applicator, the heating apparatus.

In addition, an element of a certain embodiment can be replaced by another element of other embodiment, and the configuration of other embodiment can be added to the configuration of a certain embodiment. In addition, a part of the configuration of each embodiment, addition, deletion of other configuration can be substituted.

What is claimed is:

1. An atomic layer deposition processing apparatus comprising:
a chamber lid assembly including:
a gas dispersing channel, connected to a first gas delivery system and a second gas delivery system, the gas dispersing channel extending along a central vertical axis and having an upper portion and a lower portion, the upper portion having a cylindrical shape along the central vertical axis and the lower portion having a conical shape tapering away from the central vertical axis and extending along a horizontal axis;
a first heater element and a first temperature sensor, integral to a bottom wall of the chamber lid assembly that is located above the lower portion of the gas dispersing channel, the first temperature sensor configured to detect a first temperature at a first location at a first side relative to the central vertical axis and configured to output first temperature information corresponding to the first temperature to a temperature comparator, and
a choke connected to the bottom wall of the chamber lid assembly;
a susceptor spaced a distance from the chamber lid assembly and extending along the horizontal axis, the susceptor including a substrate receiving surface, a second heater configured to heat a surface adjacent the substrate receiving surface and a second temperature sensor configured to detect a second temperature at a second location at a second side opposing the first side relative to the central vertical axis, and configured to output second temperature information corresponding to the second temperature to the temperature comparator;
a process chamber enclosing at least the chamber lid assembly and the susceptor, the process chamber that is connected to the bottom wall of the chamber lid assembly by one or more thermal attenuation parts, wherein the thermal attenuation parts attenuate heat energy generated by the first heater;
the temperature comparator configured to:
compare the first temperature information with the second temperature information; and
determine a temperature difference between the first temperature and the second temperature; and
a controller configured to:
control the first gas delivery system and the second gas delivery system to supply gases to the substrate alternately; and
control the first heater or the second heater so that the temperature difference between the first temperature at the first location and the second temperature at the second location is decreased,
wherein an outside edge of the cover is arranged further outward in a horizontal direction from the central vertical axis than a corresponding outside edge of the substrate on the susceptor, and
wherein an outside edge of an element of the first heater embedded in the cover is arranged further outward in a horizontal direction from the central vertical axis than a corresponding outside edge of the substrate on the susceptor.

2. The atomic layer deposition processing apparatus of claim 1, wherein the first heater is covered by a cover at least partially made by a material having a higher thermal conductivity than that of chamber lid assembly, the cover being installed facing the substrate receiving surface.

3. The atomic layer deposition processing apparatus of claim 1, wherein the process chamber has no wall that defines a part of the gas dispersing channel at the position corresponding to the center of a substrate disposed on the substrate receiving surface.

4. The atomic layer deposition processing apparatus of claim 1, wherein the distance between the susceptor and the chamber lid assembly is between 0.02 inches and 2.0 inches.

* * * * *